United States Patent
Jayasekara

(10) Patent No.: US 8,835,892 B2
(45) Date of Patent: Sep. 16, 2014

(54) ELECTRONIC DEVICES INCLUDING CARBON NANO-TUBE FILMS HAVING BORON NITRIDE-BASED LINERS, AND METHODS OF FORMING THE SAME

(75) Inventor: Wipul Pemsiri Jayasekara, Los Gatos, CA (US)

(73) Assignee: SanDisk 3D LLC, Milpitas, CA (US)

( * ) Notice: Subject to any disclaimer, the term of this patent is extended or adjusted under 35 U.S.C. 154(b) by 395 days.

(21) Appl. No.: 12/608,592

(22) Filed: Oct. 29, 2009

(65) Prior Publication Data

US 2010/0108981 A1 May 6, 2010

Related U.S. Application Data

(63) Continuation-in-part of application No. 12/408,419, filed on Mar. 20, 2009.

(60) Provisional application No. 61/109,905, filed on Oct. 30, 2008.

(51) Int. Cl.
| | | |
|---|---|---|
| H01L 47/00 | (2006.01) | |
| H01L 45/00 | (2006.01) | |
| H01L 27/24 | (2006.01) | |
| B82Y 10/00 | (2011.01) | |
| H01L 51/05 | (2006.01) | |
| H01L 51/00 | (2006.01) | |
| G11C 13/02 | (2006.01) | |

(52) U.S. Cl.
CPC ............... *H01L 45/04* (2013.01); *H01L 45/12* (2013.01); *H01L 27/2409* (2013.01); *H01L 45/1233* (2013.01); *H01L 45/1616* (2013.01); *G11C 2213/72* (2013.01); *H01L 51/0048* (2013.01); *H01L 45/1675* (2013.01); *B82Y 10/00* (2013.01); *G11C 2213/71* (2013.01); *G11C 13/025* (2013.01); *H01L 45/1608* (2013.01); *H01L 45/149* (2013.01); *H01L 51/0591* (2013.01); *H01L 27/2481* (2013.01)
USPC ........... 257/3; 257/77; 257/E21.005; 438/105

(58) Field of Classification Search
USPC .......................................... 257/3, 77; 438/105
See application file for complete search history.

(56) References Cited

U.S. PATENT DOCUMENTS

| | | | |
|---|---|---|---|
| 5,629,666 A | 5/1997 | Imai et al. | |
| 5,915,167 A | 6/1999 | Leedy | |

(Continued)

FOREIGN PATENT DOCUMENTS

| | | |
|---|---|---|
| EP | 1 361 608 | 11/2003 |
| EP | 1 739 753 | 1/2007 |

(Continued)

OTHER PUBLICATIONS

Murarka, S.P., et al. "Effect of Growth Parameters on the CVD of Boron Nitride and Phosphorus-Doped Boron Nitride." J. Electrochem. Soc.: Sol.-State Sci. & Technol., vol. 126, No. 11 (Nov. 1979): pp. 1951-1957.*

(Continued)

*Primary Examiner* — Mark Tornow
(74) *Attorney, Agent, or Firm* — Dugan & Dugan, PC

(57) ABSTRACT

Methods in accordance with this invention form a microelectronic structure by forming a carbon nano-tube ("CNT") layer, and forming a boron nitride layer ("BN liner") above the CNT layer, wherein the BN liner comprises: (1) a first portion disposed above and in contact with the CNT layer; and/or (2) a second portion disposed in and/or around one or more carbon nano-tubes in the CNT layer. Numerous other aspects are provided.

30 Claims, 6 Drawing Sheets

(56) References Cited

U.S. PATENT DOCUMENTS

| | | |
|---|---|---|
| 6,333,016 B1 | 12/2001 | Resasco et al. |
| 6,420,092 B1 | 7/2002 | Yang |
| 6,515,325 B1* | 2/2003 | Farnworth et al. ............ 257/296 |
| 6,833,558 B2 | 12/2004 | Lee et al. |
| 6,863,942 B2 | 3/2005 | Ren et al. |
| 6,885,021 B2 | 4/2005 | Apodaca et al. |
| 6,919,592 B2 | 7/2005 | Segal et al. |
| 6,952,030 B2 | 10/2005 | Herner et al. |
| 6,969,651 B1 | 11/2005 | Lu et al. |
| 6,986,877 B2 | 1/2006 | Takikawa et al. |
| 7,056,758 B2 | 6/2006 | Segal et al. |
| 7,084,062 B1 | 8/2006 | Avanzino et al. |
| 7,176,064 B2 | 2/2007 | Herner |
| 7,224,033 B2 | 5/2007 | Zhu et al. |
| 7,285,464 B2 | 10/2007 | Herner et al. |
| 7,301,191 B1 | 11/2007 | Tombler et al. |
| 7,345,296 B2 | 3/2008 | Tombler, Jr. et al. |
| 7,374,987 B2 | 5/2008 | Chidambarrao et al. |
| 7,390,726 B1 | 6/2008 | Issaq et al. |
| 7,483,285 B2 | 1/2009 | Furukawa et al. |
| 7,560,136 B2 | 7/2009 | Ward et al. |
| 7,575,984 B2 | 8/2009 | Radigan |
| 7,615,432 B2 | 11/2009 | Kim et al. |
| 7,618,300 B2 | 11/2009 | Liu et al. |
| 7,768,016 B2 | 8/2010 | Kreupl |
| 2003/0021966 A1 | 1/2003 | Segal et al. |
| 2003/0073295 A1 | 4/2003 | Xu |
| 2003/0222560 A1 | 12/2003 | Roach |
| 2004/0159835 A1 | 8/2004 | Krieger et al. |
| 2005/0019494 A1 | 1/2005 | Moghadam et al. |
| 2005/0052915 A1 | 3/2005 | Herner et al. |
| 2005/0148271 A1 | 7/2005 | Yaniv et al. |
| 2005/0226067 A1 | 10/2005 | Herner et al. |
| 2006/0038212 A1 | 2/2006 | Moore et al. |
| 2006/0097342 A1 | 5/2006 | Parkinson |
| 2006/0234418 A1 | 10/2006 | Ufert |
| 2006/0269692 A1 | 11/2006 | Balseanu et al. |
| 2007/0020919 A1 | 1/2007 | Adem et al. |
| 2007/0122621 A1 | 5/2007 | Kreupl et al. |
| 2007/0128858 A1 | 6/2007 | Haukka |
| 2007/0200243 A1 | 8/2007 | Kraus et al. |
| 2007/0221998 A1 | 9/2007 | Park |
| 2007/0252131 A1 | 11/2007 | Tong et al. |
| 2007/0268042 A1 | 11/2007 | Paul |
| 2007/0269992 A1 | 11/2007 | Yang et al. |
| 2008/0026523 A1 | 1/2008 | Lee et al. |
| 2008/0061283 A1* | 3/2008 | Taguchi ............................ 257/5 |
| 2008/0070162 A1 | 3/2008 | Ufert |
| 2008/0099752 A1 | 5/2008 | Kreupl et al. |
| 2008/0101121 A1 | 5/2008 | Kreupl |
| 2008/0107892 A1 | 5/2008 | Jiao et al. |
| 2008/0135834 A1 | 6/2008 | Kaza et al. |
| 2008/0173858 A1 | 7/2008 | An et al. |
| 2008/0210923 A1 | 9/2008 | Sato |
| 2008/0230826 A1 | 9/2008 | Das |
| 2008/0233396 A1 | 9/2008 | Raravikar |
| 2008/0237599 A1 | 10/2008 | Herner et al. |
| 2008/0237733 A1 | 10/2008 | Chen et al. |
| 2008/0239790 A1 | 10/2008 | Herner |
| 2008/0308785 A1 | 12/2008 | Park et al. |
| 2009/0017640 A1 | 1/2009 | Huh et al. |
| 2009/0166609 A1 | 7/2009 | Schricker |
| 2009/0166610 A1 | 7/2009 | Schricker |
| 2009/0168491 A1 | 7/2009 | Schricker |
| 2009/0213643 A1 | 8/2009 | Angerbauer et al. |
| 2009/0225588 A1 | 9/2009 | Czubatyj et al. |
| 2009/0263972 A1 | 10/2009 | Balseanu et al. |
| 2009/0278112 A1 | 11/2009 | Schricker et al. |
| 2009/0283735 A1 | 11/2009 | Li et al. |
| 2010/0001267 A1 | 1/2010 | Manning et al. |
| 2010/0008122 A1 | 1/2010 | Tilke |
| 2010/0012912 A1 | 1/2010 | Schricker |
| 2010/0019317 A1 | 1/2010 | Moroz et al. |
| 2010/0032638 A1* | 2/2010 | Xu ..................................... 257/2 |
| 2010/0032643 A1* | 2/2010 | Xu ..................................... 257/4 |
| 2010/0078759 A1 | 4/2010 | Sekar et al. |
| 2010/0102291 A1 | 4/2010 | Xu |
| 2010/0117041 A1 | 5/2010 | Hwang et al. |
| 2010/0245029 A1* | 9/2010 | Schricker et al. ............... 338/13 |
| 2011/0254126 A1 | 10/2011 | Kreupl et al. |

FOREIGN PATENT DOCUMENTS

| | | |
|---|---|---|
| EP | 1 892 722 | 2/2008 |
| EP | 1 916 722 | 4/2008 |
| JP | 2006/063369 | 3/2006 |
| WO | WO 2004/070735 | 8/2004 |
| WO | WO 2005/045871 | 5/2005 |
| WO | WO 2006/049834 A1 | 5/2006 |
| WO | WO 2006/078505 A2 | 7/2006 |
| WO | WO 2006/079979 | 8/2006 |
| WO | WO 2007/130913 A2 | 11/2007 |
| WO | WO 2008/021900 | 2/2008 |
| WO | WO 2008/036385 | 3/2008 |
| WO | WO 2009/088889 A | 7/2009 |
| WO | WO 2009/088890 A | 7/2009 |
| WO | WO 2009/137222 | 11/2009 |
| WO | WO 2010/017427 A1 | 2/2010 |
| WO | WO 2010/048408 A2 | 4/2010 |

OTHER PUBLICATIONS

Budnik et al., "A High Density, Carbon Nanotube Capacitor for Decoupling Applications", DAC 2006, Jul. 24-28, 2006, pp. 935-938.
Engelsen, "The temptation of field emission displays", Physics Procedia 1 (2008), pp. 355-365.
Restriction Requirement of U.S. Appl. No. 12/415,011 mailed Sep. 16, 2010.
Sep. 20, 2010 Reply to Restriction Requirement of U.S. Appl. No. 12/415,011 mailed Sep. 16, 2010.
Office Action of U.S. Appl. No. 12/415,011 mailed Dec. 8, 2010.
Mar. 3, 2011 Reply to Dec. 8, 2010 Office Action of U.S. Appl. No. 12/415,011.
Jan. 5, 2011 Reply to Oct. 7, 2010 Office Action of Related U.S. Appl. No. 12/408,419.
Xu et al., U.S. Appl. No. 12/465,315, filed May 13, 2009.
Schricker et al., U.S. Appl. No. 12/421,405, filed Apr. 9, 2009.
Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.
Takai et al., "Structure and Electronic Properties of a Nongraphitic Disordered Carbon System and its Heat-Treatment Effects", 2003, Physical Review B 67, 214202, pp. 214202-1-214202-11.
Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.
Xu, U.S. Appl. No. 12/536,457, filed Aug. 5, 2009.
Jayasekara et al., U.S. Appl. No. 12/408,419, filed Mar. 20, 2009.
Dittmer et al., "Low ambient temperature CVD growth of carbon nanotubes," Appl. Phys. A 84, 2006, p. 1.
Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678.
Kong et al., "Integration of a gate electrode into carbon nanotube devices for scanning tunneling microscopy," Appl. Phys. Lett. 86, 2005, pp. 112106-1-112106-3.
Bhattacharyya, et al., "Switching behaviour and high frequency response of amorphous carbon double-barrier structures". Aug. 2007, Materials Science and Engineering C, Elsevier Science S.A, CH, vol. 27 No. 5-8, pp. 957-960.
Ping et al., U.S. Appl. No. 12/608,607, filed Oct. 29, 2009.
Office Action of related U.S. Appl. No. 12/415,011 mailed Apr. 19, 2011.
Final Office Action of Related U.S. Appl. No. 12/408,419 mailed Jun. 6, 2011.
Jul. 19, 2011 Reply to Apr. 19, 2011 Office Action of related U.S. Appl. No. 12/415,011.

(56) References Cited

OTHER PUBLICATIONS

Preliminary Amendment of Related U.S. Appl. No. 12/408,419 mailed Jul. 13, 2009.
Grill, "Plasma-deposited Diamondlike Carbon and Related Materials", Jan./Mar. 1999; IBM J. Res. Develop. Vol. 43 No. 1/2, pp. 147-162.
Xu, U.S. Appl. No. 12/780,564, filed May 14, 2010.
Sep. 6, 2011 Reply to Jun. 6, 2011 Final Office Action of Related U.S. Appl. No. 12/408,419.
Notice of Allowance of related U.S. Appl. No. 12/415,011 mailed Sep. 8, 2011.
Restriction Requirement of Related U.S. Appl. No. 12/408,419 mailed Sep. 1, 2010.
Sep. 16, 2010 Reply to Sep. 1, 2010 Restriction Requirement of Related U.S. Appl. No. 12/408,419.
Office Action of Related U.S. Appl. No. 12/408,419 mailed Oct. 7, 2010.
Feb. 16, 2012 Response to Nov. 17, 2011 Office Action of Related U.S. Appl. No. 12/608,607.
Li et al., U.S. Appl. No. 13/416,135, filed Mar. 9, 2012.
International Search Report and Written Opinion of International Patent Application No. PCT/US2009/062330 mailed Apr. 6, 2010.
International Search Report and Written Opinion of International Patent Application No. PCT/US2009/062507 mailed Apr. 6, 2010.
International Search Report and Written Opinion of International Patent Application No. PCT/US2009/062532 mailed Apr. 6, 2010.
Leroy et al., "Thin film solid-state reactions forming carbides as contact materials for carbon-containing semiconductors", Journal of Applied Physics, vol. 101, No. 5, (2007) pp. 053714-1-053714-10.
Robertson, J., "Diamond-like amorphous carbon", 2002, Materials Science and Engineering, R 37, pp. 129-281.
Kanicki, J, "Role of Hydrogen in silicon nitride films prepared by various deposition techniques", 1988, MRS Proceedings 118, 671.
Office Action of Related U.S. Appl. No. 12/608,607 Nov. 17, 2011.
Notice of Allowance & Examiner Interview Summary of Related U.S. Appl. No. 12/608,607 mailed Jun. 29, 2012.
Notice of Allowance of Related U.S. Appl. No. 12/608,607 mailed Dec. 17, 2012.
International Search Report and Written Opinion of International Application No. PCT/US2010/028497 mailed Oct. 30, 2012.
Notice of Allowance of Related U.S. Appl. No. 12/608,607 mailed Oct. 29, 2012.
Office Action of Related U.S. Appl. No. 12/408,419 mailed Jul. 2, 2014.

\* cited by examiner

ELECTRONIC DEVICES INCLUDING CARBON NANO-TUBE FILMS HAVING BORON NITRIDE-BASED LINERS, AND METHODS OF FORMING THE SAME

CROSS REFERENCE TO RELATED APPLICATIONS

This application is a continuation-in-part of U.S. patent application Ser. No. 12/408,419, filed 20 Mar. 2009, titled "Electronic Devices Including Carbon-Based Films, And Methods Of Forming Such Devices" ("the '419 application"), which is incorporated by reference herein in its entirety for all purposes.

This application also claims the benefit of U.S. Provisional Patent Application Ser. No. 61/109,905, filed 30 Oct. 2008, titled "Carbon-Based Liner For Protection Of Carbon Nano-Tube Films Against Short-Circuiting And Damage" ("the '905 application"), which is incorporated by reference herein in its entirety for all purposes.

BACKGROUND

This invention relates to microelectronic devices, such as non-volatile memories, and more particularly to a memory cell that includes a non-volatile, carbon-based reversible-resistance switching element compatible with a steering element, and methods of forming the same.

Non-volatile memories formed from reversible resistance-switching elements are known. For example, U.S. patent application Ser. No. 11/968,154, filed Dec. 31, 2007, titled "Memory Cell That Employs A Selectively Fabricated Carbon Nano-Tube Reversible Resistance-Switching Element And Methods Of Forming The Same" ("the '154 Application"), which is hereby incorporated by reference herein in its entirety for all purposes, describes a rewriteable non-volatile memory cell that includes a diode coupled in series with a carbon-based reversible resistivity-switching material such as carbon.

However, fabricating memory devices from rewriteable resistivity-switching materials is technically challenging, and improved methods of forming memory devices that employ resistivity-switching materials are desirable.

SUMMARY

In a first aspect of the invention, a method of forming a microelectronic structure is provided, wherein the method includes forming a carbon nano-tube ("CNT") layer, and forming a boron nitride layer above the CNT layer, wherein the boron nitride layer comprises: (1) a first portion disposed above the CNT layer; and/or (2) a second portion disposed in and/or around one or more carbon nano-tubes in the CNT layer.

In a second aspect of the invention, a microelectronic structure is provided that includes a CNT layer, and a boron nitride layer above the CNT layer, wherein the boron nitride layer comprises: (1) a first portion disposed above and in contact with the CNT layer; and/or (2) a second portion disposed in and/or around one or more carbon nano-tubes in the CNT layer.

Other features and aspects of this invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Figure 1:
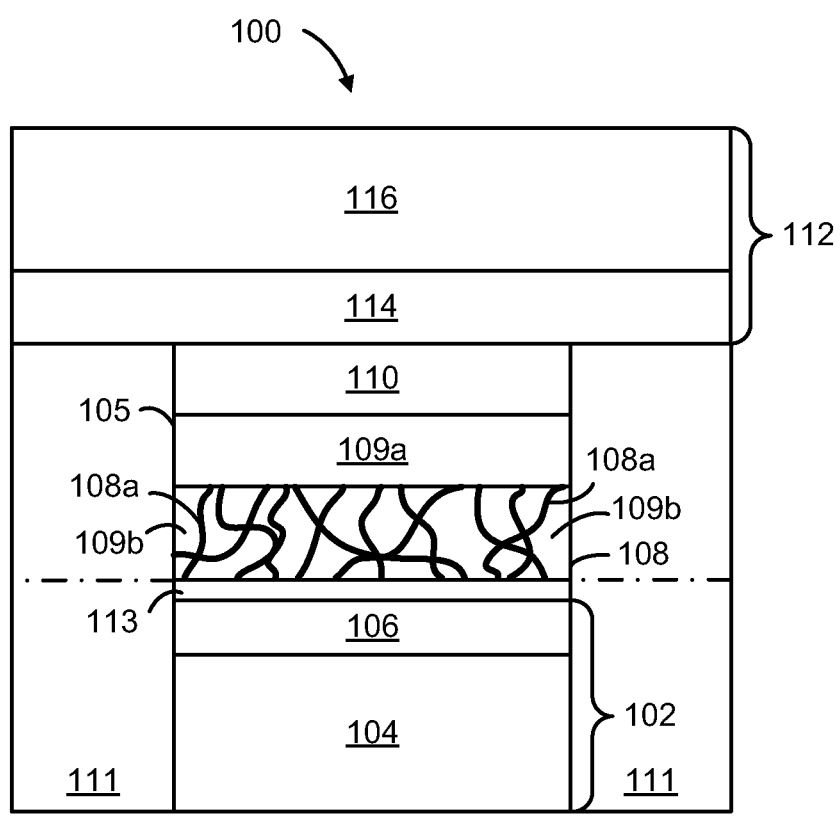
FIG. 1 depicts a cross-sectional, elevational schematic diagram of an exemplary memory cell in accordance with this present invention.

CNT materials exhibit resistivity switching behavior that may be used to form microelectronic non-volatile memories. As used herein, "CNT material" refers to material that includes one or more single and/or multi-wall carbon nano-tubes. CNT materials have demonstrated memory switching properties on lab-scale devices with a 100× separation between ON and OFF states and mid-to-high range resistance changes. Such a separation between ON and OFF states renders CNT materials viable candidates for memory cells formed using the CNT materials in series with vertical diodes, thin film transistors or other steering elements.

In the aforementioned example, a metal-insulator-metal ("MIM") structure formed from a CNT material sandwiched between two metal or otherwise conducting layers may serve as a resistance change material for a memory cell. Moreover, a CNT MIM stack may be integrated in series with a steering element, such as a diode or transistor, to create a read-writable memory device as described, for example, in the '154 Application.

Among the various challenges that integration of CNT material presents is that of etching CNT material, due to the topography of CNT material. For instance, deposited or grown CNT material typically has a rough surface topography, with pronounced thickness variations and porosity resulting in local peaks and valleys. These thickness variations make CNT materials difficult to etch, increasing fabrication costs and complexity associated with their use in integrated circuits. As such, some detail will be provided about the etching processes, but many other process parameters are covered in less detail to avoid obscuring the focus of the invention.

In addition, homogeneous CNT materials are known to be porous, so a conventionally-formed CNT-based MIM structure is prone to short-circuiting. In particular, to form a CNT memory circuit using conventional semiconductor processes, physical vapor deposition ("PVD") processing steps may be used to form the top and bottom electrodes of the memory cell. The high energy levels of PVD-based top electrode metal deposition, however, may cause metal to infiltrate, and possibly penetrate, one or more CNT material pores, possibly causing a short with the bottom electrode. Additionally, the high energy levels used during PVD of metal may damage the active switching CNT material during the top electrode deposition. Embodiments of the present invention seek to avoid such deleterious effects by limiting the exposure of the active CNT material to such high energy levels associated with PVD of top electrode metals.

In accordance with exemplary embodiments of this invention, a CNT-based MIM structure may be formed that is less prone to short-circuiting. In particular, a CNT-based MIM stack is formed by forming a bottom electrode layer, forming a layer of CNT material above the bottom electrode layer, forming a liner material (referred to herein as a "liner") above the CNT layer, and forming a top electrode layer above the liner.

In exemplary embodiments of this invention, the CNT material layer may be a porous, mesh-like network of carbon nano-tubes. In some embodiments of this invention, the CNT material layer includes a single carbon nano-tube.

In exemplary embodiments of this invention, the liner includes: (1) a first portion disposed above and in contact with the CNT layer; and/or (2) a second portion disposed in and/or around one or more carbon nano-tubes in the CNT layer. In some embodiments, the liner may penetrate and/or seal one or more pores in the CNT network. In some exemplary embodiments, the liner may include a carbon material ("carbon liner"). In alternative exemplary embodiments, the liner may include a boron nitride material ("BN liner").

Although not wishing to be bound by any particular theory, it is believed that the liner may protect the CNT material against infiltration by the top electrode layer material, and may impede penetration of the top electrode layer material into the sealed pores. In some embodiments, the liner also reduces and/or prevents damage to the CNT material during top electrode layer deposition by shielding the CNT material from exposure to the top electrode layer deposition process.

In accordance with alternative exemplary embodiments of this invention, a microelectronic structure, such as a memory device, and methods of forming such structures, are provided that have a top electrode deposited on top of active CNT material using a deposition technique, such as chemical vapor deposition ("CVD"), atomic layer deposition ("ALD"), electron beam ("e-beam") evaporation, or a combination of such techniques, that has lower energy levels than conventional PVD techniques. In some embodiments, use of such relatively lower energy deposition techniques (compared to conventional PVD techniques) reduces and/or prevents infiltration of a top electrode material into the CNT material. In addition, use of the previously mentioned deposition techniques reduces and/or prevents damage to the CNT material during top electrode deposition in some embodiments.

In accordance with further alternative exemplary embodiments of this invention, a microelectronic structure, such as a memory device, and methods of forming such structures, are provided that include having a CNT MIM stack formed using a lower energy deposition technique to deposit the top electrode, and the MIM may be integrated in series with steering element, such as a diode or transistor, to create a read-writable memory device.

In accordance with still further exemplary embodiments of this invention, a microelectronic structure, such as a memory device, and methods of forming such structures, are provided that include having a CNT MIM stack formed using a lower energy deposition technique to deposit the top electrode on a carbon liner or a BN liner, and the MIM may include a dielectric sidewall liner that protects the CNT material against deterioration possible during deposition of dielectric gap fill material.

In exemplary embodiments in accordance with this invention, the CNT material may be composed of, but is not limited to, pure carbon nano-tubes deposited by CVD growth techniques, colloidal spray on techniques, and spin on techniques. The active switching carbon layer may be composed of a mixture of carbon nano-tubes with amorphous carbon ("aC") or other dielectric filler material in any ratio deposited in any of the above mentioned techniques. An exemplary embodiment of this integration scheme includes a spin or spray application of the CNT material, followed by deposition of liner, such as a carbon liner or a BN liner.

As used herein, "CNT material" is a shorthand reference to the carbon-based resistivity switching material forming the active layer, although the carbon material is not limited to pure carbon nano-tubes, as mentioned above. As used herein, the carbon-based resistivity-switchable material layer may include CNT material as well as carbon in many other forms, e.g., non-CNT carbon-based materials, including, for example, graphene, graphite, aC, silicon carbide, boron carbide and other similar carbon-based materials. The nature of the carbon-based layer may be characterized by its ratio of forms of carbon-carbon bonding. Carbon typically bonds to carbon to form either an $sp^2$-bond (a trigonal double C=C bond) or an $sp^3$-bond (a tetrahedral single C—C bond). A ratio of $sp^2$-bonds to $sp^3$-bonds can be determined via Raman spectroscopy by evaluating the D and G bands. In some embodiments, the range of materials may include those having a ratio such as $M_y N_z$ where M is the $sp^3$ material and N is the $sp^2$ material and y and z are any fractional values from zero to 1 as long as y+z=1.

Additionally, CNT material deposition methods may include, but are not limited to, sputter deposition from a target, plasma-enhanced chemical vapor deposition ("PECVD"), PVD, CVD, arc discharge techniques, and laser ablation. Deposition temperatures may range from about 200° C. to about 650° C., more generally from about 25° C. to about 900° C. A precursor gas source may include, but is not limited to, hexane, cyclo-hexane, acetylene, single and double short chain hydrocarbons (e.g., methane), various benzene based hydrocarbons, polycyclic aromatics, short chain ester, ethers, alcohols, or a combination thereof. In some cases, a "seeding" or "cracking" surface (e.g., about 1-100 angstroms of iron ("Fe"), nickel ("Ni"), cobalt ("Co") or the like, although other thicknesses may be used) may be used to promote growth at reduced temperatures.

The CNT material may be deposited in any thickness. In some embodiments, the CNT material may be between about 100 and about 800 angstroms, more generally between about 10 and about 1000 angstroms. Other thicknesses may be used.

Lower energy deposition techniques may be used to form a top electrode with minimal energy imparted to the underlying material, thereby reducing the potential for damage to the carbon memory layer. More specifically, a lower energy deposition technique exposes a deposition surface to less energy than physical vapor deposition does. The energy level of a lower energy deposition technique preferably is insufficient to damage the layer of carbon-based material and thereby render it non-functional. Likewise, the energy level preferably is insufficient to cause the top electrode to infiltrate into and/or penetrate through the layer of carbon-based material.

Lower energy deposition techniques for deposition of the top electrode may include, for instance, CVD, PECVD, thermal CVD, ALD or e-beam evaporation. The ALD method also may include plasma enhanced ALD ("PE-ALD"), "high-throughput" ALD, and any hybridization of ALD and CVD. Materials appropriate for deposition using CVD, PECVD and ALD include, but are not limited to, silicon ("Si"), tungsten ("W"), titanium ("Ti"), tantalum ("Ta"), molybdenum ("Mo"), tungsten nitride ("WN"), titanium nitride ("TiN"), tantalum nitride ("TaN"), titanium carbon nitride ("TiCN"), and tantalum carbon nitride ("TaCN"). Materials appropriate for deposition using thermal CVD include, but are not limited to, doped polysilicon, W and WN. Film layers appropriate for deposition using e-beam evaporation may include W, Ti, Ta or mixed targets thereof.

As described above, in exemplary embodiments of this invention, a liner may be formed above CNT material. In some embodiments, the liner includes (1) a first portion disposed above and in contact with the CNT layer; and/or (2) a second portion disposed in and/or around one or more carbon nano-tubes in the CNT layer. In some embodiments, the liner may penetrate and/or seal one or more pores in the CNT material.

In an exemplary embodiment of this invention, the liner may be a carbon liner that includes one or more of aC, graphene, graphite, silicon carbide, boron carbide or other similar carbon-based materials. Amorphous carbon may further include microcrystalline or nanocrystalline particles of graphitic carbon and/or diamond-like carbon.

A carbon liner may be deposited using a similar or different deposition technique than that used to deposit the CNT material. For example, the carbon liner may be formed by sputter deposition from a target, PECVD, PVD, CVD, arc discharge techniques, and laser ablation. Deposition temperatures may range from about 200° C. to about 650° C., more generally from about 25° C. to about 900° C. A precursor gas source may include, but is not limited to, hexane, cyclo-hexane, acetylene, single and double short chain hydrocarbons (e.g., methane), various benzene based hydrocarbons, polycyclic aromatics, short chain ester, ethers, alcohols, or a combination thereof. Other deposition techniques, temperatures, and precursors may be used.

The carbon liner may be deposited in any thickness. In some embodiments, the carbon liner may be between about 20 and about 250 angstroms, more generally between about 5 and about 800 angstroms, although other thicknesses may be used.

Table 1 below describes an exemplary process window for forming a carbon liner 109 within a PECVD chamber using a processing gas comprising one or more hydrocarbon compounds and a carrier/dilutant gas. Persons of ordinary skill in the art will understand that the carrier gas may comprise any suitable inert or non-reactive gas such as one or more of He, Ar, $H_2$, Kr, Xe, $N_2$, etc. In some embodiments, the hydrocarbon compounds may have the formula $C_xH_y$, with x ranging from about 2 to 4, and y ranging from about 2 to 10.

TABLE 1

EXEMPLARY PECVD PROCESS PARAMETERS

| PROCESS PARAMETER | EXEMPLARY RANGE | PREFERRED RANGE |
| --- | --- | --- |
| Precursor Flow Rate (sccm) | 10-5000 | 100-2000 |
| Carrier Flow Rate (sccm) | 10-10000 | 1000-7000 |
| Carrier/Precursor Ratio | 1:1-100:1 | 1:1-50:1 |
| Chamber Pressure (Torr) | 0.8-10 | 3-8 |
| $1^{st}$ RF frequency (MHz) | 10-50 | 13.5 |
| $2^{nd}$ RF frequency (KHz) | 90-500 | 90 |
| RF Power Density (W/in$^2$) | 0.1-20 | 0.3-5 |
| $2^{nd}$ RF/$1^{st}$ RF Power Density Ratio | 0-1 | 0-0.5 |
| Process Temperature (° C.) | 100-700 | 400-650 |
| Electrode Spacing (Mils) | 200-1000 | 200-500 |

Other flow rates, pressures, frequencies, power densities, power density ratios, process temperatures, and/or electrode spacings may be used.

In an exemplary embodiment of this invention, the carbon liner includes: (1) a first portion disposed above and in contact with the CNT layer; and/or (2) a second portion disposed in and/or around one or more carbon nano-tubes in the CNT layer. In an exemplary embodiment, the carbon liner may penetrate and/or seal one or more pores in the CNT material.

As with the CNT material, the carbon liner has a ratio of $sp^2$ (trigonal double C=C bonds) to $sp^3$ (tetrahedral single C—C bonds) that can be determined via Raman spectroscopy by evaluating the D and G bands. In some embodiments, the range of materials may include those having a ratio such as $M_yN_z$ where M is the $sp^3$ material and N is the $sp^2$ material and y and z are any fractional values from zero to 1 as long as y+z=1.

In an alternative embodiment of this invention, the liner may be a BN liner that includes one or more of boron nitride, boron carbon nitride, borazine ("$B_xH_yN_z$"), doped boron nitride (referred to herein as "BXN," where "X" is one or more additional elements, such as silicon, oxygen, tungsten, tantalum, cobalt, molybdenum, titanium, gallium, arsenic, aluminum, phosphorous, hafnium, or other similar element, introduced by doping, ion implantation, or other means), or other forms of boron nitride. In addition, the BN liner may include boron nitride in one or more its polymorphs, such as hexagonal boron nitride, cubic boron nitride, amorphous boron nitride, boron nitride nano-tubes, and other forms.

The BN liner may be formed by sputter deposition from a target, ALD, PECVD, PVD, CVD, arc discharge techniques, and laser ablation. Deposition temperatures may range from about 200° C. to about 650° C., more generally from about 25° C. to about 900° C. A precursor gas source may include, but is not limited to, boron trichloride ("$BCl_3$"), boric acid ("$B(OH)_3$"), diboron trioxide ("$B_2O_3$"), boron tribromide ("$BBr_3$"), diborane ("$B_2H_6$"), boron triflouride ("$BF_3$"), boron trichloride ("$BCl_3$"), boron sulfide ("$B_2S_3$"), borane ("$B_xH_y$"), or a combination thereof. Other deposition techniques, temperatures, and precursors may be used.

Table 2 below describes an exemplary process window for forming a BN liner 109 by ALD.

TABLE 2

EXEMPLARY ALD BN LINER PROCESS PARAMETERS

| | Thermal ALD | | Plasma ALD | |
| --- | --- | --- | --- | --- |
| PROCESS PARAMETER | EXEMPLARY RANGE | PREFERRED RANGE | EXEMPLARY RANGE | PREFERRED RANGE |
| Cycle 1 Temp (° C.) | 400-600 | 400-500 | 200-600 | 400-500 |
| Cycle 1 Pressure (T) | 0.1-10 | 1-3 | 0.1-10 | 1-3 |
| Cycle 1 Dose (sccm) | 20-500 | 50-300 | 20-500 | 50-300 |
| Cycle 2 Temp (° C.) | 300-600 | 350-450 | 200-600 | 350-450 |
| Cycle 2 Pressure (T) | 0.1-10 | 1-3 | 0.1-10 | 1-3 |
| Cycle 2 Dose (sccm) | 100-2000 | 100-800 | 100-2000 | 100-800 |
| RF Frequency (MHz) | — | — | 10-50 | 12-15 |
| RF Power (W) | — | — | 50-500 | 50-250 |
| Plasma Pulse Time (seconds) | — | — | 5-100 | 10-40 |

Exemplary cycle 1 precursors include $BCl_3$, $BBr_3$ $B_2H_6$, $BF_3$, with $BCl_3$ being a preferred precursor, and exemplary cycle 2 precursors include $NH_3$, $N_2H_4$, $N_2+H_2$, with $NH_3$ being a preferred precursor. For Plasma ALD, a remote downstream plasma also can be used to generate the plasma rather than an RF source. Other precursors, temperatures, pressures, flow rates, frequencies, powers, and/or pulse times may be used.

BN may be deposited in cycles, in which ALD of boron ("B") is followed by ALD of N. In a first cycle, the B deposition cycle, a boron precursor is allowed to deposit onto the surface. A first purge step is performed to remove any of the first precursor which remains and which has not been deposited on the substrate. In a second cycle, the N deposition cycle, a nitrogen precursor is allowed to absorb and/or react with the adsorbed B, to produce about a monolayer of boron nitride. A second purge step is performed to remove any of the second precursor which remains and which has not reacted with the B. The number of pairs of cycles determines the overall film thickness.

The BN liner may be deposited in any thickness. In some embodiments, the BN liner may be between about 20 and about 250 angstroms, more generally between about 5 and about 800 angstroms, although other thicknesses may be used.

By way of another example, Table 3 below describes exemplary process windows for forming a BN liner 109 by PVD using boron nitride and boron targets.

TABLE 3

EXEMPLARY PVD BN LINER PROCESS PARAMETERS

| PROCESS PARAMETER | Boron Nitride Target | | Boron Target | |
|---|---|---|---|---|
| | EXEMPLARY RANGE | PREFERRED RANGE | EXEMPLARY RANGE | PREFERRED RANGE |
| Argon Flow rate (sccm) | 1-500 | 10-250 | 1-500 | 10-250 |
| Nitrogen Flow Rate (sccm) | 0-500 | 0-150 | 1-500 | 10-150 |
| Sputter Pressure (mTorr) | 0.01-50 | 0.1-20 | 0.01-50 | 0.1-20 |
| Substrate Temperature (° C.) | 25-800 | 100-400 | 25-800 | 100-400 |
| Substrate Bias (Volts) | 0-1500 | 0-500 | 0-1500 | 0-500 |
| Target Power (KW) | 0.1-10 | 0.5-6 | 0.1-10 | 0.5-6 |

Other gasses, flow rates, pressures, temperatures, bias voltages, and/or target powers may be used.

In an exemplary embodiment of this invention, the BN liner includes: (1) a first portion disposed above and in contact with the CNT layer; and/or (2) a second portion disposed in and/or around one or more carbon nano-tubes in the CNT layer. In an exemplary embodiment, the BN liner may penetrate and/or seal one or more pores in the CNT material.

Exemplary Embodiments

In accordance with a first exemplary embodiment of this invention, formation of a microelectronic structure includes formation of an MIM device having a CNT material disposed between a bottom electrode and a top electrode, with a liner, such as a carbon liner or a BN liner, disposed above the CNT material. The top electrode may be deposited using a lower energy deposition technique. The CNT material may comprise undamaged, or reduced-damage, CNT material that is not penetrated, and preferably not infiltrated, by the top electrode.

FIG. 1 is a cross-sectional elevational view of a first exemplary microelectronic structure 100, also referred to as memory element 100, provided in accordance with this invention. Memory element 100 may be used in conjunction with a steering element (e.g., an externally-provided diode, transistor or other similar steering element) to form a memory cell. Memory element 100 includes a first conductor 102 formed over a substrate (not shown), such as over an insulating layer over the substrate. The first conductor 102 may include a first metal layer 104, such as tungsten, copper ("Cu"), aluminum ("Al"), gold ("Au"), or other metal layer. In an exemplary embodiment, first metal layer 104 may be tungsten and have a thickness between about 1200 angstroms and about 2000 angstroms, more generally between about 500 angstroms and about 3000 angstroms. Other materials and/or thicknesses may be used.

First conductor 102 may comprise a lower portion of a MIM structure 105 and function as a bottom electrode of MIM 105. An adhesion layer 106, such as a TiN, TaN, W, WN, Mo, or similar material, is optional but is shown in FIG. 1 formed over the first metal layer 104. For example, adhesion layer 106 may be TiN having a thickness between about 100 and about 1200 angstroms, more generally between about 20 and about 3000 angstroms.

In general, a plurality of first conductors 102 may be provided and isolated from one another (e.g., by employing silicon dioxide ("$SiO_2$") or other dielectric material isolation between each of first conductors 102). For instance, first conductor 102 may be a word-line or a bit-line of grid-patterned array.

In some embodiments of this invention, an optional boron nitride layer 113 may be formed over first conductor 102. For example, boron nitride layer 113 may be formed having a thickness between about 20 angstroms and about 250 angstroms, more generally between about 5 angstroms and about 800 angstroms. Boron nitride layer 113 may be formed by sputter deposition from a target, ALD, PECVD, PVD, CVD, arc discharge techniques, and laser ablation, as described above.

Although not wanting to be bound by any particular theory, it is believed that CNT material may bond better to boron nitride layer 113 than to a metal electrode. In addition, boron nitride layer 113 may reduce metal migration into the memory cell during high electrical stress operation.

A layer of resistivity-switchable material 108 containing carbon nano-tubes 108a is formed over first conductor 102 (or optional boron nitride layer 113) using any exemplary CNT formation process. For simplicity, carbon-based material layer 108 will be referred to as "CNT layer 108"). CNT layer 108 may have a thickness between about 100 and about 800 angstroms, more generally between about 10 and about 1000 angstroms. CNT layer 108 may comprise a middle portion of MIM structure 105. CNT layer 108 may include a porous, mesh-like network of carbon nano-tubes 108a.

CNT layer 108 may be deposited by various techniques. One technique involves spray- or spin-coating a CNT suspension over the first conductor 102, thereby creating a random CNT material. Another technique involves growing carbon nano-tubes from a seed anchored to the substrate by CVD, PECVD or the like. In exemplary embodiments of this invention, CNT layer 108 may be deposited using techniques such as described in the '154 application, and related U.S. patent application Ser. No. 11/968,156, filed Dec. 31, 2007, titled "Memory Cell That Employs A Selectively Fabricated Carbon Nano-Tube Reversible Resistance-Switching Element Formed Over A Bottom Conductor And Methods Of Forming The Same", and U.S. patent application Ser. No. 11/968,159, filed Dec. 31, 2007, titled "Memory Cell With Planarized Carbon Nanotube Layer And Methods Of Forming The Same", which are hereby incorporated by reference herein in their entireties for all purposes.

In some embodiments in accordance with this invention, following deposition/formation of CNT layer 108, an anneal step may be performed to modify the properties of CNT layer 108. In particular, the anneal may be performed in a vacuum or the presence of one or more forming gases, at a temperature in the range from about 350° C. to about 900° C., for about 30 to about 180 minutes. The anneal preferably is performed in about an 80% ($N_2$):20% ($H_2$) mixture of forming gases, at about 625° C. for about one hour.

This anneal may be performed prior to the formation of a top electrode above CNT layer 108. A queue time of about 2 hours between the anneal and the electrode metal deposition preferably accompanies the use of the anneal. A ramp up duration may range from about 0.2 hours to about 1.2 hours and preferably is between about 0.5 hours and about 0.8 hours. Similarly, a ramp down duration also may range from about 0.2 hours to about 1.2 hours and preferably is between about 0.5 hours and about 0.8 hours.

Although not wanting to be bound by any particular theory, it is believed that CNT layer 108 may absorb water from the air and/or might have one or more functional groups attached to CNT layer 108 after CNT layer 108 is formed. Organic functional groups are sometimes required for pre-deposition processing. One of the exemplary functional groups is a carboxylic group. Likewise, it is believed that the moisture and/or organic functional groups may increase the likelihood of delamination of CNT layer 108. In addition, it is believed that the functional groups may attach to CNT layer 108, for instance, during a cleaning and/or filtering process. The post-carbon-formation anneal may remove the moisture and/or carboxylic or other functional groups associated with CNT layer 108. As a result, in some embodiments, delamination of CNT layer 108 and/or top electrode material from a substrate is less likely to occur if CNT layer 108 is annealed prior to formation of the top electrode over CNT layer 108.

Incorporation of such a post-CNT-formation-anneal preferably takes into account other layers present on the device that includes CNT layer 108, inasmuch as these other layers will also be subject to the anneal. For example, the anneal may be omitted or its parameters may be adjusted where the aforementioned preferred anneal parameters would damage the other layers. The anneal parameters may be adjusted within ranges that result in the removal of moisture and/or carboxylic or other functional groups without damaging the layers of the annealed device. For instance, the temperature may be adjusted to stay within an overall thermal budget of a device being formed. Likewise, any exemplary forming gases, temperatures and/or durations may be used that are appropriate for a particular device. In general, such an anneal may be used with any carbon-containing material, such as layers having CNT material, graphite, graphene, amorphous carbon, silicon carbide, boron carbide and other similar carbon-based materials.

Exemplary forming gases may include one or more of nitrogen ("$N_2$"), argon ("Ar"), and hydrogen ("$H_2$"), whereas preferred forming gases may include a mixture having above about 75% $N_2$ or Ar and below about 25% $H_2$. Alternatively, a vacuum may be used. Exemplary temperatures may range from about 585° C. to about 675° C., more generally from about 350° C. to about 900° C. Exemplary durations range from about 1 hour to about 1.5 hours, more generally from about 0.5 hour to about 3 hours. Exemplary pressures may range from about 300 mT to about 600 mT, more generally from about 1 mT to about 760 T.

In some embodiments in accordance with this invention, following deposition/formation of CNT layer 108, a liner layer 109 may be formed above CNT layer 108. Liner 109 may be between about 20 angstroms and about 250 angstroms, more generally from about 5 angstroms and about 800 angstroms. Other thicknesses may be used.

In the illustrated embodiment, liner 109 includes: (1) a first portion 109a disposed above and in contact with CNT layer 108; and (2) a second portion 109b disposed in and/or around one or more carbon nano-tubes 108a in CNT layer 108. In exemplary embodiments of this invention, liner 109 may penetrate and/or seal one or more pores in CNT layer 108.

Liner 109 may serve as a defensive interface with layers above it, in particular the top electrode layers. As previously mentioned, in exemplary embodiments of this invention, liner 109 may be a carbon liner or may be a BN liner.

For example, a carbon liner 109 preferably may include one or more of amorphous carbon, and/or other non-CNT carbon-based materials, such as graphene, graphite, diamond-like carbon, other variations of $sp^2$-rich or $sp^3$-rich carbon materials, silicon carbide, boron carbide and other similar carbon-based materials. An exemplary process for forming a carbon liner 109 is described above in Table 1. Alternatively, a BN liner 109 preferably may include one or more of boron nitride, boron carbon nitride, borazine, BXN, or other form of born-nitride material. Exemplary processes for forming a BN liner 109 are described above in Tables 2 and 3.

Liner 109 and its thickness also may be selected to exhibit vertical electrical resistance appropriate for memory element 100 in which it is incorporated, taking into account, for example, preferred read, write, and programming voltages or currents. Vertical resistance (e.g., in the direction of current travel between the two electrodes as shown in FIG. 1, of CNT layers 108 and liner 109) will determine current or voltage differences during operation of microelectronic structure 100. Vertical resistance depends, for instance, on material vertical resistivity and thickness, and feature size and critical dimension. In the case of CNT layer 108, vertical resistance may differ from horizontal resistance, depending on the orientation of the carbon nano-tubes themselves, as they appear to be more conductive along the tubes than between the tubes.

After formation of liner 109, an adhesion/barrier layer 110, such as TiN, TaN, W, WN, Mo, TaCN, or the like, may be formed over liner 109 (or CNT layer 108 if liner 109 is not used). For example, adhesion/barrier layer 110 may be TiN with a thickness of between about 100 angstroms and about 1200 angstroms, more generally between about 20 angstroms and about 3000 angstroms. As shown in FIG. 1, adhesion layer 110 may function as a top electrode of MIM device 105 that includes CNT layer 108 and optional liner 109, and first metal layer 104 and optional adhesion layer 106 as the bottom electrode. As such, the following sections refer to adhesion/barrier layer 110 as "top electrode 110" of MIM 105.

In some embodiments in accordance with this invention, top electrode 110 may be deposited using a lower energy deposition technique, e.g., one involving energy levels lower than those used in PVD of similar materials. Such exemplary deposition techniques may include chemical vapor deposition, plasma enhanced CVD, thermal CVD, atomic layer deposition, plasma enhanced ALD, a combination of CVD and ALD, and electron beam evaporation, and other similar techniques.

Use of a lower energy deposition technique to deposit top electrode 110 on the carbon material reduces the potential for deposition-associated damage to CNT layer 108 and the potential for infiltration and/or penetration of CNT layer 108 by top electrode 110. In embodiments foregoing the use of a liner 109, use of lower energy deposition techniques may be particularly advantageous to limit the deleterious effects of the deposition of top electrode 110. Subsequent to the lower energy deposition of top electrode 110, CNT layer 108 preferably remains undamaged and substantially free of top electrode 110 material, which otherwise might have infiltrated CNT layer 108 under higher-energy, PVD-type conditions.

Even if CNT layer 108 experiences some damage or infiltration at a top portion (e.g., near liner 109) serving as an interface with top electrode 110, at least a core portion of CNT layer 108 preferably remains functional as a switching element, being undamaged and not infiltrated. Top electrode 110 preferably forms an interface having a sharp profile delimiting the top electrode material and the carbon material. In the event that no liner 109 is present, the possibly-compromised top portion and functioning core may be subdivisions of CNT layer 108. This result preferably applies to the embodiments of FIGS. 2-4 as well.

The MIM stack 105 may be patterned, for example, with about 1.2 microns to about 1.4 microns, more generally about 1 micron to about 1.5 microns, of photoresist using standard photolithographic techniques. Top electrode 110 then may be etched using boron trichloride ("$BCl_3$") and chlorine ("$Cl_2$") chemistries, for example, as described below, or any other exemplary etch. In some embodiments, top electrode 110, liner 109, and CNT layer 108 may be patterned using a single etch step. In other embodiments, separate etch steps may be used.

The CNT materials may be etched using, for example, $BCl_3$ and $Cl_2$. Such a method is compatible with standard semiconductor tooling. For example, a plasma etch tool may generate a plasma based on $BCl_3$ and $Cl_2$ gas flow inputs, generating reactive species such as Cl+ that may etch a CNT material. In some embodiments, a low bias power of about 100 Watts or less may be employed, although other power ranges may be used. Exemplary processing conditions for a CNT material, plasma etch process are provided below in Table 4. Other flow rates, chamber pressures, power levels, process temperatures, and/or etch rates may be used.

TABLE 4

EXEMPLARY PLASMA ETCH PROCESS PARAMETERS

| PROCESS PARAMETER | BROAD RANGE | NARROW RANGE |
|---|---|---|
| $BCl_3$ Flow Rate (sccm) | 30-70 | 45-60 |
| $Cl_2$ Flow Rate (sccm) | 0-50 | 15-25 |
| Pressure (milliTorr) | 50-150 | 80-100 |
| Substrate Bias RF (Watts) | 50-150 | 85-110 |
| Plasma RF (Watts) | 350-550 | 390-410 |
| Process Temperature (° C.) | 45-75 | 60-70 |
| Etch Rate (Å/sec) | 3-10 | 4-5 |

Such an etched film stack has been observed to have nearly vertical sidewalls and little or no undercut of CNT layer 108. Alternatively, CNT materials may be etched using oxygen chemistries. For example, Table 5 provides exemplary process parameters for an oxygen-based etch. Other etch chemistries may be used.

TABLE 5

OXYGEN-BASED ETCH PROCESS PARAMETERS

| PROCESS PARAMETER | BROAD RANGE | NARROW RANGE |
|---|---|---|
| $O_2$ Flow Rate (sccm) | 0-80 | 10-45 |
| $N_2$ Flow Rate (sccm) | 30-120 | 50-80 |
| Ar Flow Rate (sccm) | 30-120 | 50-80 |
| Pressure (milliTorr) | 0.1-50 | 0.6-8 |
| RF Bias (Watts) | 100-200 | 125-175 |
| RF Source (Watts) | 400-700 | 550-670 |
| Temperature (° C.) | 30-80 | 50-75 |
| Etch Rate (Angstroms/sec) | 2-80 | 15-45 |

The defined top electrode/liner/CNT features may be isolated with $SiO_2$ or other dielectric fill 111, and then planarized. A second conductor 112 may be formed over top electrode 110. Second conductor 112 may include a barrier/adhesion layer 114, such as TiN, W, WN, Mo, TaN or a similar material, and a metal layer 116 (e.g., tungsten or other conductive material).

The MIM device 105 may serve as a state change material for memory element 100. CNT layer 108 may form a reversible resistance-switching element of the memory element 100, wherein the memory element is adapted to switch two or more resistivity states. For example, memory element 100 may be coupled in series with a steering element such as a diode, a tunnel junction, or a transistor, such as a thin film transistor ("TFT"). In at least one embodiment, the steering element may include a polycrystalline vertical diode.

Memory operation is based on a bi-stable resistance change in CNT layer 108 with the application of high bias voltage (e.g., >4 V). Current through memory element 100 is modulated by the resistance of CNT layer 108. Memory element 100 is read at a lower voltage that will not change the resistance of CNT layer 108. In some embodiments, the difference in resistivities between the two states may be over 100×. Memory element 100 may be changed from a "0" to a "1," for example, with the application of high forward bias on the steering element (e.g., a diode). Memory element 100 may be changed back from a "1" to a "0" with the application of a high forward bias. As stated, this integration scheme can be extended to include CNT materials in series with a TFT as the steering element instead of a vertical pillar diode. The TFT steering element may be either planar or vertical.

In accordance with a second exemplary embodiment of this invention, formation of a microelectronic structure includes formation of a memory cell that includes a steering element in series with an MIM device having a carbon film disposed between a bottom electrode and a top electrode. The carbon film may comprise a CNT layer with a liner, such as a carbon liner or a BN liner, above the CNT layer. The top electrode may be deposited using a lower energy deposition technique, and the carbon film may comprise undamaged, or reduced-damage, CNT material that is not penetrated, and preferably not infiltrated, by the top electrode.

Figure 2A:
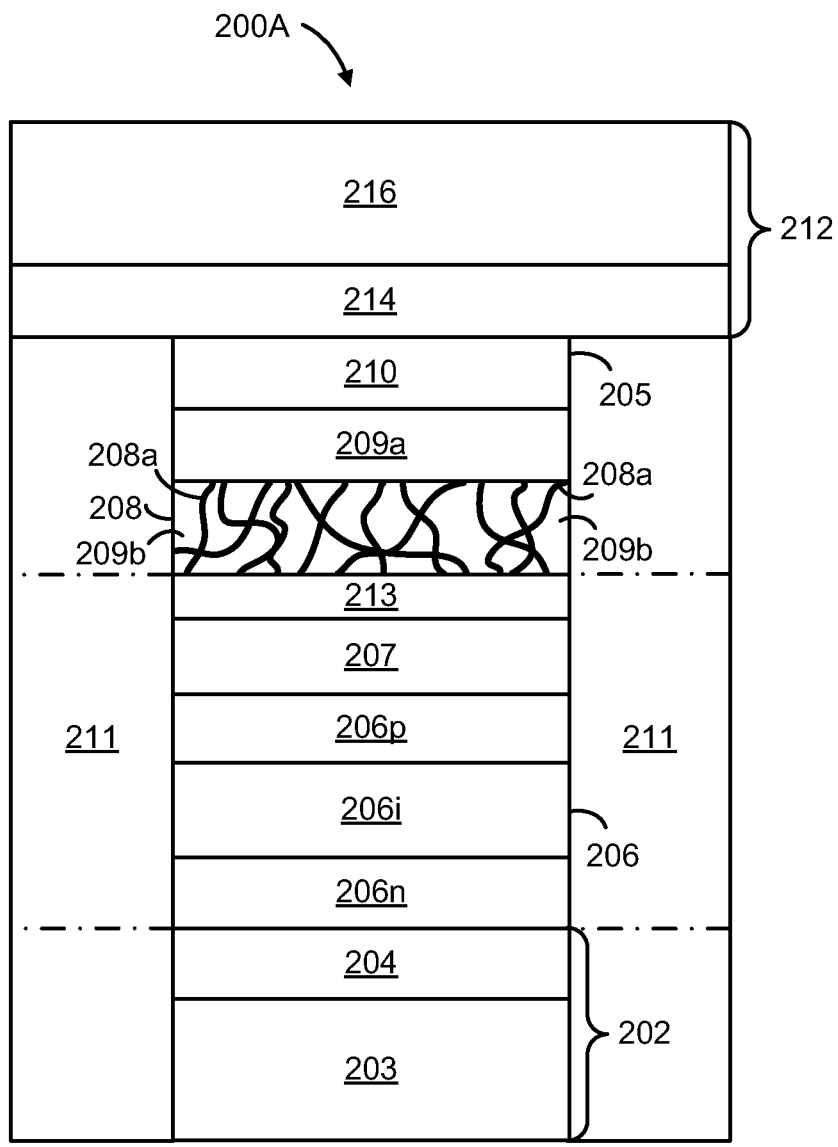
FIGS. 2A and 2B depict elevational cross-sections of alternative exemplary memory cells in accordance with this invention.
Figure 2B:
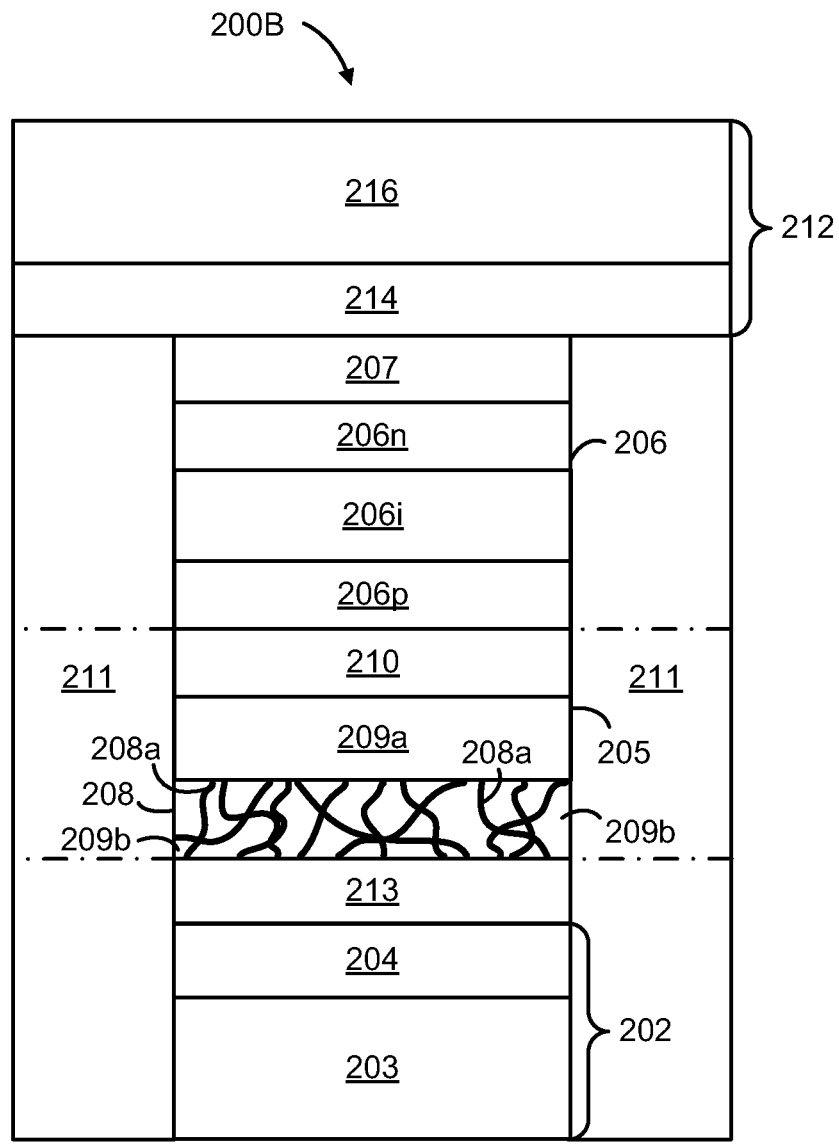

FIG. 2A is a cross-sectional elevational view of an exemplary memory cell structure 200A provided in accordance with the present invention in which the steering element is a diode. In particular, memory cell structure 200A includes a first conductor 202 formed over a substrate (not shown), such as over an insulating layer covering the substrate. First conductor 202 may include a first metal layer 203, such as a W, Cu, Al, Au, or other metal layer, with a first barrier/adhesion layer 204, such as a TiN, W, WN, Mo, TaN or similar layer, formed over first metal layer 203.

In general, a plurality of first conductors 202 may be provided and isolated from one another. For instance, after patterning and etching first conductors 202, a gap fill deposition of $SiO_2$ or other dielectric material may isolate each of first conductors 202. After depositing dielectric material over first conductors 202, the device structure may be planarized to re-expose the electrically-isolated first conductors 202.

A vertical P-I-N (or N-I-P) diode 206 may be formed above first conductor 202. For example, diode 206 may include a polycrystalline semiconductor (e.g., polysilicon, polygermanium, silicon-germanium alloy, etc.) diode. Diode 206 may include a layer 206n of heavily doped n+ semiconductor material, having an exemplary thickness of between about 200 angstroms and about 800 angstroms; a layer 206i of intrinsic or lightly doped semiconductor material, having an exemplary thickness of between about 600 angstroms and about 2400 angstroms; and a layer 206p of heavily doped p+ semiconductor material, having an exemplary thickness of between about 200 angstroms and about 800 angstroms. Persons of ordinary skill in the art will understand that the vertical order of layers 206n, 206i, and 206p may be reversed.

As described in more detail below, in some embodiments, a silicide region (not shown) may be formed in contact with diode 206.

An adhesion/barrier layer 207 may be formed above diode 206 and may comprise, for instance, about 20 angstroms to about 3000 angstroms of TiN, TaN, W, WN, Mo, TaCN, or other similar conductive adhesion or barrier material.

In some embodiments of this invention, an optional boron nitride layer 213 may be formed over adhesion/barrier layer 207. For example, boron nitride layer 213 may be formed having a thickness between about 20 angstroms and about 250 angstroms, more generally between about 5 angstroms and about 800 angstroms. Boron nitride layer 213 may be formed by sputter deposition from a target, ALD, PECVD, PVD, CVD, arc discharge techniques, and laser ablation, as described above.

Although not wanting to be bound by any particular theory, it is believed that CNT material may bond better to boron nitride layer 213 than to a metal electrode. In addition, boron nitride layer 213 may reduce metal migration into the memory cell during high electrical stress operation.

In some embodiments, a metal hard mask (not shown) such as W or the like may be employed on top of adhesion/barrier layer 207. Adhesion/barrier layer 207 and diode 206 may be patterned and etched to form a pillar. [If the diode is patterned separately, the optional boron nitride layer would not be patterned at that stage. Instead, it would be deposited after patterning. In general, a plurality of these pillars may be provided and isolated from one another, such as by employing $SiO_2$ or other dielectric material isolation between each of the pillars (e.g., by depositing dielectric material over the pillars and then planarizing the device structure to re-expose the electrically-isolated pillars).

Adhesion layer 207 (and optional boron nitride layer 213) may function as a bottom electrode of MIM device 205 that includes a CNT layer 208 and an optional liner 209, and an adhesion layer 210 as a top electrode. As such, the following sections refer to adhesion/barrier layer 207 (and optional boron nitride layer 213) as "bottom electrode 207" of MIM 205 with respect to FIG. 2A.

A CNT layer 208 containing carbon nano-tubes 208a may be formed over bottom electrode 207 using any exemplary CNT formation process (as described previously). In some embodiments in accordance with this invention, following deposition/formation of CNT layer 208 (and any anneal step, as described above), a liner 209 may be formed above CNT layer 208.

Liner 209 may be a carbon liner or a BN liner, or may include other similar material, and may be formed as described above, such as described previously with reference to FIG. 1. Liner 209 may be between about 20 angstroms and about 250 angstroms, more generally from about 5 angstroms and about 800 angstroms. Other thicknesses may be used.

In the illustrated embodiment, liner 209 includes: (1) a first portion 209a disposed above and in contact with CNT layer 208; and (2) a second portion 209b disposed in and/or around one or more carbon nano-tubes 208a in CNT layer 208. In exemplary embodiments of this invention, liner 209 may penetrate and/or seal one or more pores in CNT layer 208.

Following deposition/formation of CNT layer 208 and liner 209, a second adhesion/barrier layer 210, such as TiN, W, WN, Mo, TaN or the like, is formed over liner 209. As described above, adhesion layer 210 may function as a top electrode of MIM 205. As such, the following sections refer to adhesion/barrier layer 210 as "top electrode 210" of MIM 205.

In some embodiments in accordance with this invention, top electrode 210 may be deposited using a lower energy deposition technique, such as chemical vapor deposition, atomic layer deposition, a combination of CVD and ALD techniques, and/or electron beam evaporation. The MIM stack may be patterned, for example, with about 1 to about 1.5 microns, more preferably about 1.2 to about 1.4 microns, of photoresist using standard photolithographic techniques. The stack then is etched.

In some embodiments, CNT layer 208 and liner 209 may be etched using a different etch step than the etch step used for the top electrode 210 (e.g., consecutively in the same chamber). For example, top electrode 210 may be etched using a chlorine process (e.g., as described above in connection with Table 4), whereas CNT layer 208 may be etched using a chlorine-argon chemistry (described below), or an oxygen chemistry (e.g., as described above in connection with Table 5). In other embodiments, a single etch step may be used. However, in some embodiments, it has been found that using argon during the carbon material etch increases the etch rate of the carbon material.

Etching carbon materials using chlorine and argon chemistries may be performed as described below, and such a method is compatible with standard semiconductor tooling. For example, a plasma etch tool may generate a plasma based on $BCl_3$, $Cl_2$ and argon gas flow inputs, generating reactive species such as Cl+ and Ar+ that may etch a CNT material. In some embodiments, a low bias power of about 100 Watts or less may be employed, although other power ranges may be used. Exemplary processing conditions for a CNT material, plasma etch process are provided below in Table 3. Other flow rates, chamber pressures, power levels, process temperatures, and/or etch rates may be used.

TABLE 6

EXEMPLARY PLASMA ETCH PROCESS PARAMETERS

| PROCESS PARAMETER | BROAD RANGE | NARROW RANGE |
| --- | --- | --- |
| $BCl_3$ Flow Rate (sccm) | 30-70 | 45-60 |
| $Cl_2$ Flow Rate (sccm) | 0-50 | 15-25 |
| Argon Flow Rate (sccm) | 0-50 | 15-25 |
| Pressure (milliTorr) | 50-150 | 80-100 |
| Substrate Bias RF (Watts) | 100-200 | 125-175 |

TABLE 6-continued

EXEMPLARY PLASMA ETCH PROCESS PARAMETERS

| PROCESS PARAMETER | BROAD RANGE | NARROW RANGE |
|---|---|---|
| Plasma RF (Watts) | 350-550 | 390-410 |
| Process Temperature (° C.) | 45-75 | 60-70 |
| Etch Rate (Å/sec) | 10-20 | 13.8-14.5 |

Such an etched film stack has been observed to have nearly vertical sidewalls and little or no undercut of CNT layer 208. The defined top electrode/liner/CNT features are then isolated with $SiO_2$ or other dielectric fill 211, planarized and a second conductor 212 is formed over top electrode 210 and gap fill 211. Second conductor 212 may comprise, for instance, about 500 angstroms to about 6000 angstroms of conductive material. Second conductor 212 may include an optional barrier/adhesion layer 214, such as about 20 angstroms to about 3000 angstroms of TiN, TaN, W, WN, molybdenum, or a similar layer, and a metal layer 216, such as about 500 angstroms to about 3000 angstroms of W or other conductive layer.

In exemplary embodiments, the etch stack may include about 1.2 microns to about 1.4 microns, more generally about 0.1 micron to about 1.5 microns of photoresist, about 1000 to about 3000 angstroms of $SiO_2$ hardmask, about 200 to about 2200 angstroms of TiN (per TiN layer), about 100 to about 800 angstroms of CNT material 208, and about 20 to about 250 angstroms of a carbon material or a boron nitride material as liner 209. Other material thicknesses may be used. The oxide hard mask may be etched using an oxide etcher and conventional chemistries using an endpoint to stop on top electrode 210. The adhesion/barrier and CNT layers may be etched using a metal etcher, for example. An exemplary metal etcher is the LAM 9600 metal etcher, available from Lam of Fremont, Calif. Other etchers may be used.

In some embodiments, the photoresist ("PR") may be ashed using standard procedures before continuing to the adhesion/barrier and CNT etch, whereas in other embodiments the PR is not ashed until after the CNT etch. In both cases, a 2000 angstrom TiN adhesion/barrier layer may be etched using about 85-110 Watts bias, about 45-60 standard cubic centimeters per minute ("sccm") of $BCl_3$, and about 15-25 sccm of $Cl_2$ for about a 60 second timed etch. Other bias powers, flow rates and etch durations may be used. In embodiments in which the PR is ashed, the CNT etch may include about 45-60 sccm of $BCl_3$, about 15-25 sccm of $Cl_2$ and about 15-25 sccm of Argon using about 125-175 Watts bias for about 55-65 seconds. In embodiments in which the PR is not ashed, the identical conditions may be used with a longer etch time (e.g., about 60-70 seconds). In either case, a chuck temperature of 60-70° C. may be employed during the CNT etch. Exemplary ranges for the CNT dry etch include about 100 to 250 Watts bias, about 45° C. to 85° C. chuck temperature, and a gas ratio range of about 2:1 to 5:1 $BCl_3:Cl_2$ and about 5:1 Ar:$Cl_2$ to no argon. The etch time may be proportional to the CNT thickness.

An ash may be used for a post-etch clean when the PR is not ashed prior to etching. For example, the bias and/or directionality component of the ashing process may be increased and the pressure of oxygen during the ashing process may be reduced. Both attributes may help to reduce undercutting of the CNT material. Any exemplary ashing tool may be used, such as an Iridia Asher available from GaSonics International of San Jose, Calif.

In some embodiments, an ashing process may include two steps (e.g., when a third high pressure oxygen step is removed). Exemplary process conditions for the first ashing step are provided in Table 7 below. Exemplary process conditions for the second ashing step are provided in Table 8 below. Other flow rates, pressures, RF powers and/or times may be used.

TABLE 7

EXEMPLARY FIRST ASHING STEP PROCESS PARAMETERS

| PROCESS PARAMETER | BROAD RANGE | NARROW RANGE |
|---|---|---|
| $CF_4$ Flow Rate (sccm) | 10-50 | 20-30 |
| $N_2H_2$ Flow Rate (sccm) | 80-120 | 90-110 |
| $H_2O_2$ Flow Rate (sccm) | 200-350 | 260-290 |
| Pressure (milliTorr) | 600-800 | 650-750 |
| Substrate Bias RF (Watts) | 0 | 0 |
| Plasma RF (Watts) | 350-450 | 400-430 |
| Time (seconds) | 20-120 | 50-70 |

TABLE 8

EXEMPLARY SECOND ASHING STEP PROCESS PARAMETERS

| PROCESS PARAMETER | BROAD RANGE | NARROW RANGE |
|---|---|---|
| $O_2$ Flow Rate (sccm) | 350-450 | 380-420 |
| Pressure (milliTorr) | 200-600 | 380-440 |
| Substrate Bias RF (Watts) | 50-200 | 90-120 |
| Plasma RF (Watts) | 350-450 | 400-430 |
| Time (seconds) | 20-120 | 50-70 |

The bias power may be increased from zero for normal processing. No ashing is used post CNT etch when PR ashing is performed prior to CNT etching. Ashing time is proportional to resist thickness used. Post CNT etch cleaning, whether or not PR ashing is performed before CNT etching, may be performed in any exemplary cleaning tool, such as a Raider tool, available from Semitool of Kalispell, Mont. Exemplary post CNT etch cleaning may include using ultra-dilute sulfuric acid (e.g., about 1.5-1.8 wt %) for about 60 seconds and ultra-dilute HF (e.g., about 0.4-0.6 wt %) for 60 seconds. Megasonics may or may not be used.

In the embodiment of FIG. 2A, diode 206 is formed below MIM 205. Persons of ordinary skill in the art will understand that diode 206 alternatively may be formed above MIM 205, such as in memory cell 200B illustrated in FIG. 2B.

In accordance with a third exemplary embodiment of this invention, formation of a microelectronic structure includes formation of a memory cell that includes a dielectric sidewall liner to protect the CNT material from degradation during a dielectric fill step. The dielectric sidewall liner and its use are compatible with standard semiconductor tooling.

Figure 3A:
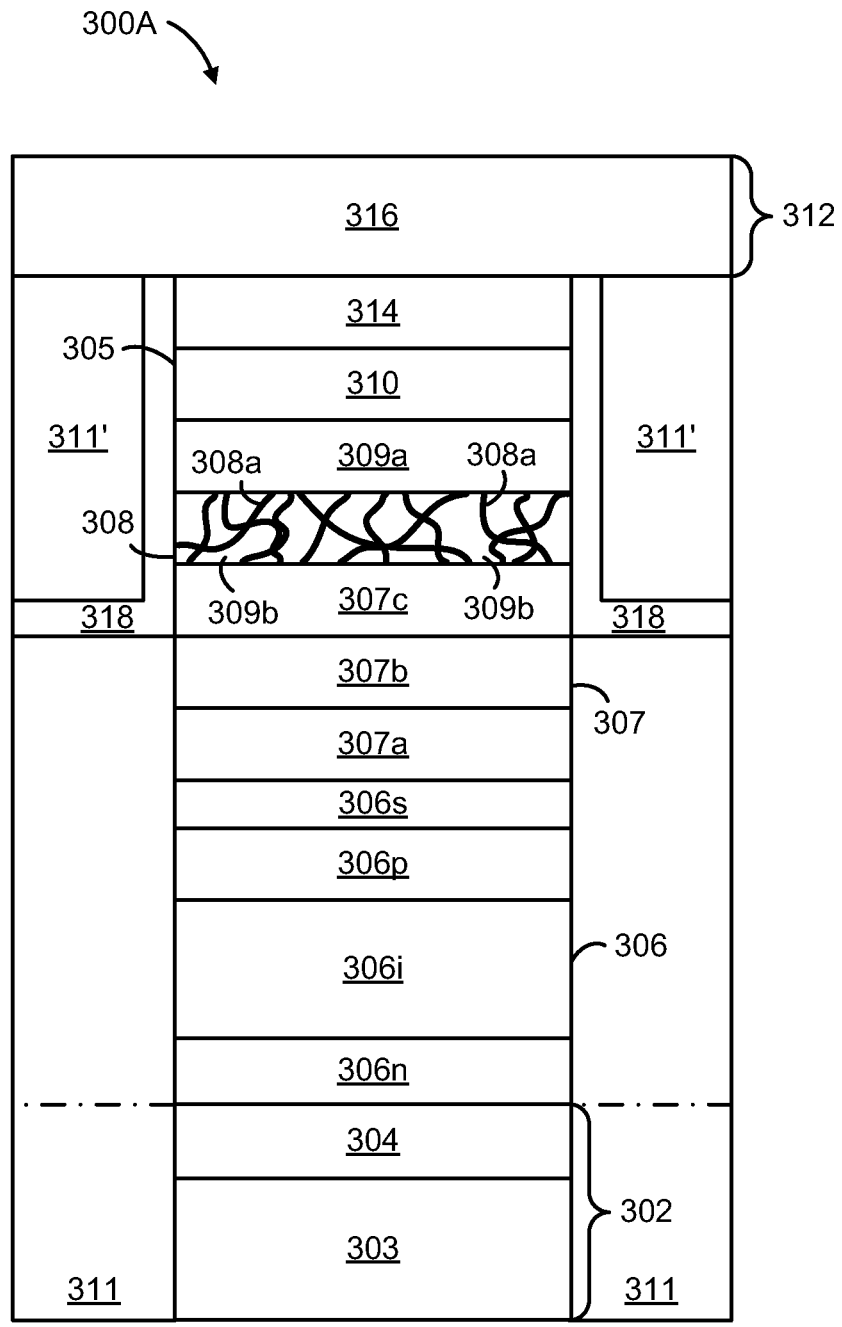
FIGS. 3A and 3B depict elevational cross-sections of still other exemplary memory cells in accordance with this invention.

FIG. 3A is a cross-sectional elevational view of an exemplary memory cell structure 300A provided in accordance with the present invention. In particular, memory cell structure 300A includes a diode disposed below an MIM device having a CNT film covered by a liner and disposed between a bottom electrode and a top electrode.

As shown in FIG. 3A, memory cell structure 300A includes a first conductor 302 formed over a substrate (not shown). First conductor 302 may include a first metal layer 303, such as a W, Cu, Al, Au, or other metal layer, with a first barrier/adhesion layer 304, such as a TiN, W, WN, Mo, TaN or similar layer, formed over first metal layer 303. In general, a plurality of first conductors 302 may be provided and isolated from one another (e.g., by employing SiO$_2$ or other dielectric material isolation between each of the first conductors 302).

A vertical P-I-N (or N-I-P) diode 306 is formed above first conductor 302. For example, diode 306 may include a polycrystalline semiconductor (e.g., polysilicon, polygermanium, silicon-germanium alloy, etc.) diode. Diode 306 may include a layer 306n of heavily doped n+ semiconductor material; a layer 306i of intrinsic or lightly doped semiconductor material; and a layer 306p of heavily doped p+ semiconductor material. Alternatively, the vertical order of the diode 306 layers 306n, 306i, and 306p may be reversed.

In some embodiments, an optional silicide region 306s may be formed over diode 306. As described in U.S. Pat. No. 7,176,064, which is hereby incorporated by reference herein in its entirety for all purposes, silicide-forming materials such as titanium and cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of diode 306 during annealing). Lower resistivity silicon thereby is provided. Similar results may be achieved for silicon-germanium alloy and/or germanium diodes. In some embodiments using silicide region 306s to crystallize diode 306, silicide region 306s may be removed after such crystallization, so that silicon region 306s does not remain in the finished structure.

A TiN or other adhesion/barrier layer or layer stack 307 may be formed above diode 306. In some embodiments, adhesion/barrier layer 307 may comprise a layer stack 307 including a first adhesion/barrier layer 307a, a metal layer 307b, such as of W, and a further adhesion/barrier layer 307c, such as of TiN.

In the event that a layer stack 307 is used, layers 307a and 307b may serve as a metal hard mask that may act as a chemical mechanical planarization ("CMP") stop layer and/or etch-stop layer. Such techniques are disclosed, for example, in U.S. patent application Ser. No. 11/444,936, "Conductive Hard Mask To Protect Patterned Features During Trench Etch," filed May 31, 2006, which is hereby incorporated by reference herein in its entirety for all purposes. For instance, diode 306 and layers 307a and 307b may be patterned and etched to form pillars, and dielectric fill material 311 may be formed between the pillars. The stack may then be planarized, such as by CMP or etch-back, to co-expose the gap fill 311 and layer 307b. Layer 307c may then be formed on layer 307b. Alternatively, layer 307c may be patterned and etched along with diode 306 and layers 307a and 307b. In some embodiments, layer 307c may be eliminated, and CNT layer 308 may interface directly with layer 307b (e.g., W).

Thereafter, a CNT layer 308 containing carbon nano-tubes 308a may be formed over adhesion/barrier layer or layer stack 307 using any exemplary CNT formation process (as described previously). In some embodiments in accordance with this invention, an optional boron nitride layer (not shown) may be formed over adhesion/barrier layer 307 prior to forming CNT layer 308. In some embodiments in accordance with this invention, following deposition/formation of CNT layer 308 (and any anneal step, as described above), a liner 309 may be formed above CNT layer 308.

Liner 309 may comprise a carbon liner, a BN liner, or may contain other similar liner material, formed as described above. Liner 309 may be between about 20 angstroms and about 250 angstroms, more generally from about 5 angstroms and about 800 angstroms. Other thicknesses may be used.

In the illustrated embodiment, liner 309 includes: (1) a first portion 309a disposed above and in contact with CNT layer 308; (2) and a second portion 309b disposed in and/or around one or more carbon nano-tubes 308a in CNT layer 308. In exemplary embodiments of this invention, liner 309 may penetrate and/or seal one or more pores in CNT layer 308.

Following deposition/formation of liner 309, a second adhesion/barrier layer 310, such as TiN, W, WN, Mo, TaN or the like, is formed over liner 309.

Adhesion layer 307 may function as a bottom electrode of MIM device 305 that includes CNT layer 308 and optional liner 309, and an adhesion layer 310 as a top electrode. As such, the following sections refer to adhesion/barrier layer 307 as "bottom electrode 307" with respect to FIG. 3A. Similarly, adhesion/barrier layer 310 is referred to as "top electrode 310" of the MIM 305 of FIG. 3A.

Top electrode 310 may be deposited using a lower energy deposition technique, such as chemical vapor deposition, atomic layer deposition, a combination of CVD and ALD, and/or electron beam evaporation. An additional hardmask and/or CMP stop layer 314 also may be formed (as shown).

Before formation of a top conductor 312, which may include an adhesion layer (not shown) and a conductive layer 316, the stack may be patterned, for example, with about 1.2 microns to about 1.4 microns, more generally about 0.1 micron to about 1.5 microns photoresist using standard photolithographic techniques. The stack then is etched. If an etching process was performed to create the pillars mentioned above, then the etch may apply to layers 308, 309, 310, and possibly 307c and 314. For example, layers 314, 310 may serve as a hardmask and/or CMP stop for CNT layer 308 and liner 309.

In some embodiments, CNT layer 308 and liner 309 may be etched using a different etch step than the etch step used for second adhesion/barrier layer 310 (e.g., consecutively in the same chamber). For example, the stack may be etched using a plasma etcher and using a chlorine chemistry followed by a chlorine-argon chemistry under low bias conditions (e.g., a chlorine chemistry may be used to etch the TiN film and a chlorine-argon chemistry may be used to etch the CNT material), as described previously with reference to the second embodiment. In other embodiments, a single etch step may be used (e.g., using a chlorine chemistry, such as in Table 4, an oxygen chemistry, such as in Table 5, or a chlorine-argon chemistry, such as in Table 6, for both the TiN and CNT materials). Such an etched film stack has been observed to have nearly vertical sidewalls and little or no undercut of the CNT material 308. In some embodiments, CNT layer 308 may be overetched such that etching of underlying dielectric gap fill material may occur.

After the etch of MIM layerstack 305, the stack may be cleaned prior to dielectric gap fill. After cleaning, deposition of gap fill 311' may occur. Standard PECVD techniques for depositing dielectric material may employ an oxygen plasma component that is created in the initial stages of deposition. This initial oxygen plasma may harm CNT layer 308, causing undercutting and poor electrical performance. To avoid this oxygen plasma exposure, a dielectric liner 318 may be formed with a different deposition chemistry (e.g., without a high oxygen component) to protect CNT layer 308 and liner 309 as the remaining gap-fill dielectric 311' (e.g., SiO$_2$) is deposited. In one exemplary embodiment, a silicon nitride dielectric liner 318 followed by a standard PECVD SiO$_2$ dielectric fill 311' may be used. Stoichiometric silicon nitride is Si$_3$N$_4$, but "SiN" is used herein to refer to stoichiometric and non-stoichiometric silicon nitride alike.

In the embodiment of FIG. 3A, a dielectric liner 318 is deposited conformally over the top electrode/liner/CNT features (or top electrode/liner/CNT/TiN features) before gap fill portion 311', e.g., the remainder of the dielectric gap fill, is deposited. Dielectric liner 318 preferably covers the outer sidewalls of CNT layer 308 and liner 309 and isolates them from dielectric fill 311'. In some embodiments, dielectric liner 318 may comprise about 200 to about 500 angstroms of SiN. However, the structure optionally may comprise other layer thicknesses and/or other materials, such as $Si_xC_yN_z$ and $Si_xN_yO_z$ (with low O content), etc., where x, y and z are non-zero numbers resulting in stable compounds. In embodiments in which CNT layer 308 is overetched such that etching of underlying dielectric gap fill material occurs, fill liner 318 may extend below CNT layer 108.

The defined top electrode/liner/CNT (or top electrode/liner/CNT/TiN) features are then isolated, with $SiO_2$ or other dielectric fill 311', and planarized, to co-expose top electrode 310 and gap fill 311'. A second conductor 312 is formed over second adhesion/barrier layer 310, or layer 314, if layer 314 is used as a hard mask and etched along with layers 308, 309, and 310. The second conductor 312 may include a barrier/adhesion layer, such as TiN, TaN or a similar layer, as shown in FIGS. 1 and 2, and a metal layer 316, such as a W or other conductive layer. In contrast to FIGS. 1 and 2, FIG. 3 depicts a layer 314 of tungsten deposited on adhesion/barrier layer 310 before the stack is etched, so that layer 314 is etched as well. Layer 314 may act as a metal hard mask to assist in etching the layers beneath it. Insofar as layers 314 and 316 both may be tungsten, they should adhere to each other well. Optionally, a $SiO_2$ hard mask may be used.

In one exemplary embodiment, a SiN dielectric liner 318 may be formed using the process parameters listed in Table 9. Other powers, temperatures, pressures, thicknesses and/or flow rates may be used.

TABLE 9

SiN DIELECTRIC LINER PROCESS PARAMETERS

| PROCESS PARAMETER | BROAD RANGE | NARROW RANGE |
|---|---|---|
| $SiH_4$ Flow Rate (sccm) | 0.1-2.0 | 0.4-0.7 |
| $NH_3$ Flow Rate (sccm) | 2-10 | 3-5 |
| $N_2$ Flow Rate (sccm) | 0.3-4 | 1.2-1.8 |
| Temperature (° C.) | 300-500 | 350-450 |
| Low Frequency Bias (kW) | 0-1 | 0.4-0.6 |
| High Frequency Bias (kW) | 0-1 | 0.4-0.6 |
| Thickness (Angstroms) | 200-500 | 280-330 |

Liner film thickness scales linearly with time. Preferably after dielectric liner 318 is deposited, the remaining thicker dielectric fill 311' may be immediately deposited (e.g., in the same tool). Exemplary $SiO_2$ dielectric fill conditions are listed in Table 10. Other powers, temperatures, pressures, thicknesses and/or flow rates may be used.

TABLE 10

EXEMPLARY $SiO_2$ DIELECTRIC FILL PROCESS PARAMETERS

| PROCESS PARAMETER | BROAD RANGE | NARROW RANGE |
|---|---|---|
| $SiH_4$ Flow Rate (sccm) | 0.1-2.0 | 0.2-0.4 |
| $N_2O$ Flow Rate (sccm) | 5-15 | 9-10 |
| $N_2$ Flow Rate (sccm) | 0-5 | 1-2 |
| Temperature (° C.) | 300-500 | 350-450 |
| Low Frequency Bias (kW) | 0 | 0 |
| High Frequency Bias (kW) | 0.5-1.8 | 1-1.2 |
| Thickness (Angstroms) | 50-5000 | 2000-3000 |

Gap fill film thickness scales linearly with time. The $SiO_2$ dielectric fill 311' can be any thickness, and standard $SiO_2$ PECVD methods may be used.

Using an exemplary thinner SiN liner 318 preferably gives a continuous film and adequate protection to the oxygen plasma from a PECVD $SiO_2$ deposition without the stress associated with thicker SiN films. Additionally, standard oxide chemistry and slurry advantageously may be used to chemically mechanically polish away a thin SiN liner 318 before forming conductor 312, without having to change to a SiN specific CMP slurry and pad part way through the polish.

Experimental data indicate that use of a dielectric liner 318 provided the highest yield of devices with forward currents in the range from about $10^{-5}$ to about $10^{-4}$ amperes. Additionally, use of a SiN liner 318 provided individual devices with the largest cycles of operation. Moreover, data indicate that using thin SiN liner 318 as a protective barrier against CNT material degradation during a dielectric fill improves electrical performance.

In the embodiment of FIG. 3A, diode 306 is formed below MIM 305. Persons of ordinary skill in the art will understand that diode 306 alternatively may be formed above MIM 305, such as in memory cell 300B illustrated in FIG. 3B.

Figure 3B:
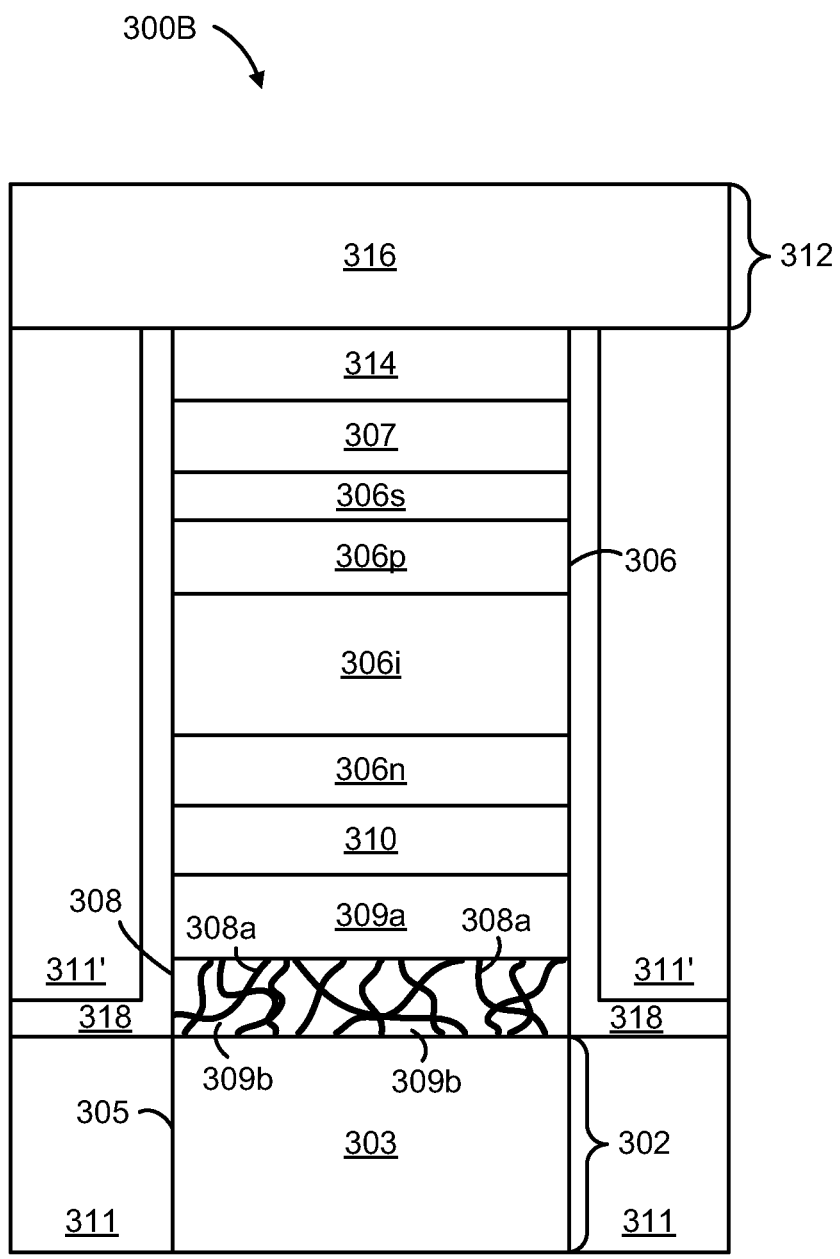

As shown in FIG. 3B, microelectronic structure 300B may include the diode 306 positioned above CNT layer 308 and liner 309, causing some rearrangement of the other layers. In particular, CNT layer 308 may be deposited either on an adhesion/barrier layer 307c, as shown in FIG. 3A, or directly on lower conductor 302, as shown in FIG. 3B. Tungsten from a lower conductor 302 may assist catalytically in formation of CNT layer 308. Liner 309 then may be formed on CNT layer 308. An adhesion/barrier layer 310 may be formed on liner 309, followed by formation of diode 306, including possible silicide region 306s. An adhesion/barrier layer 307 may be formed on diode 306 (with or without silicide region 306s).

FIG. 3B depicts a layer 314, such as tungsten, on layer 307, and layer 314 may serve as a metal hard mask and/or adhesion layer to the metal layer 316 of second conductor 312, preferably also made of tungsten. The stack may be patterned and etched into a pillar, as described above, and a dielectric liner 318 may be deposited conformally on the pillar and the dielectric fill 311 that isolates the first conductors 302. In this case, liner 318 may extend upward the entire height of the stack between first conductor 302 and second conductor 312.

In accordance with a fourth exemplary embodiment of this invention, formation of a microelectronic structure includes formation of a monolithic three dimensional memory array including memory cells comprising an MIM device having a carbon-based memory element disposed between a bottom electrode and a top electrode. The carbon-based memory element may comprise an optional carbon liner or a BN liner above CNT material. The top electrode in the MIM may be deposited using a lower energy deposition technique, such as chemical vapor deposition, atomic layer deposition, a combination of CVD and ALD, and/or electron beam evaporation.

Figure 4:
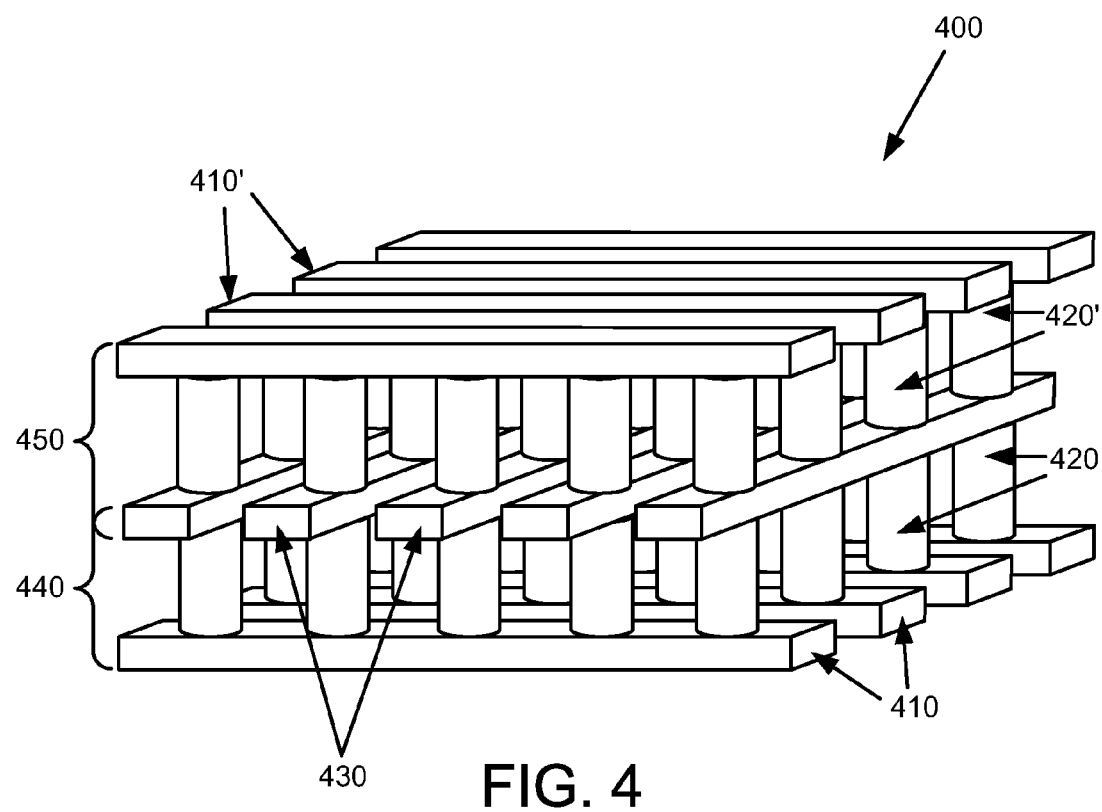
FIG. 4 is a perspective view of an exemplary memory level of a monolithic three dimensional memory array provided in accordance with this invention.

FIG. 4 shows a portion of a memory array 400 of exemplary memory cells formed according to the fourth exemplary embodiment of the present invention. Memory array 400 may include first conductors 410, 410' that may serve as wordlines or bitlines, respectively; pillars 420, 420' (each pillar 420, 420' comprising a memory cell); and second conductors 430, that may serve as bitlines or wordlines, respectively. First conductors 410, 410' are depicted as substantially perpendicular to second conductors 430. Memory array 400 may include one or more memory levels. A first memory level 440 may include the combination of first conductors 410, pillars 420 and second conductors 430, whereas a second memory level 450 may include second conductors 430, pillars 420' and first conductors 410'. Fabrication of such a memory level is described in detail in the applications incorporated by reference herein.

Embodiments of the present invention prove particularly useful in formation of a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167. The substrates may be thinned or removed from the memory levels before bonding, but as the memory levels are initially formed over separate substrates, such memories are not true monolithic three dimensional memory arrays.

A related memory is described in Herner et al., U.S. patent application Ser. No. 10/955,549, filed Sep. 29, 2004, titled "Nonvolatile Memory Cell Without A Dielectric Antifuse Having High- And Low-Impedance States" (the "'549 application"), which is hereby incorporated by reference herein in its entirety for all purposes. The '549 application describes a monolithic three dimensional memory array including vertically oriented p-i-n diodes like diode 206 of FIG. 2. As formed, the polysilicon of the p-i-n diode of the '549 application is in a high-resistance state. Application of a programming voltage permanently changes the nature of the polysilicon, rendering it low-resistance. It is believed the change is caused by an increase in the degree of order in the polysilicon, as described more fully in Herner et al., U.S. patent application Ser. No. 11/148,530, filed Jun. 8, 2005, titled "Nonvolatile Memory Cell Operating By Increasing Order In Polycrystalline Semiconductor Material" (the "'530 application"), which is incorporated by reference herein in its entirety for all purposes. This change in resistance is stable and readily detectable, and thus can record a data state, allowing the device to operate as a memory cell. A first memory level is formed above the substrate, and additional memory levels may be formed above it. These memories may benefit from use of the methods and structures according to embodiments of the present invention.

Another related memory is described in Herner et al., U.S. Pat. No. 7,285,464, (the "'464 patent"), which is incorporated by reference herein in its entirety for all purposes. As described in the '464 patent, it may be advantageous to reduce the height of the p-i-n diode. A shorter diode requires a lower programming voltage and decreases the aspect ratio of the gaps between adjacent diodes. Very high-aspect ratio gaps are difficult to fill without voids. A thickness of at least 600 angstroms is preferred for the intrinsic region to reduce current leakage in reverse bias of the diode. Forming a diode having a silicon-poor intrinsic layer above a heavily n-doped layer, the two separated by a thin intrinsic capping layer of silicon-germanium, will allow for sharper transitions in the dopant profile, and thus reduce overall diode height.

In particular, detailed information regarding fabrication of a similar memory level is provided in the '549 application and the '464 patent, previously incorporated. More information on fabrication of related memories is provided in Herner et al., U.S. Pat. No. 6,952,030, "A High-Density Three-Dimensional Memory Cell," owned by the assignee of the present invention and hereby incorporated by reference herein in its entirety for all purposes. To avoid obscuring the present invention, this detail will be not be reiterated in this description, but no teaching of these or other incorporated patents or applications is intended to be excluded. It will be understood that the above examples are non-limiting, and that the details provided herein may be modified, omitted, or augmented to the extent that the results fall within the scope of the invention.

The foregoing description discloses exemplary embodiments of the invention. Modifications of the above disclosed apparatus and methods that fall within the scope of the invention will be readily apparent to those of ordinary skill in the art. Accordingly, although the present invention has been disclosed in connection with exemplary embodiments, it should be understood that other embodiments may fall within the spirit and scope of the invention, as defined by the following claims.

The invention claimed is:

1. A method of forming a microelectronic structure, the method comprising:
    forming a carbon nano-tube ("CNT") layer; and
    forming a boron nitride layer ("BN liner") above the CNT layer, wherein the BN liner comprises:
    (1) a first portion disposed above and in contact with the CNT layer; and
    (2) a second portion disposed in the CNT layer around one or more carbon nano-tubes.

2. The method of claim 1, wherein the BN liner comprises one or more of boron nitride, boron carbon nitride, borazine, and doped boron nitride.

3. The method of claim 1, wherein the BN liner comprises a thickness between about 5 angstroms and about 800 angstroms.

4. The method of claim 1, wherein forming the BN liner comprises forming the BN liner by one or more of plasma-enhanced chemical vapor deposition, physical vapor deposition, and chemical vapor deposition.

5. The method of claim 1, wherein forming the BN liner comprises forming the BN liner at a temperature between about 25° C. and about 900° C.

6. The method of claim 1, wherein forming the BN liner comprises using a forming gas comprising one or more of boric acid, diboron trioxide, boron tribromide, boron trifluoride, boron sulfide, and borane.

7. The method of claim 1, further comprising forming a boron nitride layer below the CNT layer.

8. The method of claim 1, wherein forming the CNT layer comprises using a chemical vapor deposition growth technique, a colloidal spray-on technique, or a spin-on technique.

9. The method of claim 1, wherein the CNT layer has a thickness of between about 10 and about 1000 angstroms.

10. The method of claim 1, wherein the CNT layer comprises one or more of graphene, graphite, amorphous carbon, silicon carbide, and boron carbide.

11. The method of claim 1, further comprising:
    forming a bottom electrode below and in contact with the CNT layer; and
    forming a top electrode above and in contact with the BN liner.

12. The method of claim 1, further comprising forming a steering element coupled to the CNT layer.

13. The method of claim 12, wherein the microelectronic structure is a memory device.

14. The method of claim 12, wherein the steering element comprises a diode.

15. The method of claim 14, wherein the diode comprises a semiconductor diode.

16. A memory cell formed by the method of claim 1.

17. A memory level formed by the method of claim 1.

18. A three-dimensional memory array formed by the method of claim 1.

19. A microelectronic structure comprising:
   a carbon nano-tube ("CNT") layer; and
   a boron nitride layer ("BN liner") comprising:
   (1) a first portion disposed above and in contact with the CNT layer; and
   (2) a second portion disposed in the CNT layer around one or more carbon nano-tubes.

20. The microelectronic structure of claim 19, wherein the BN liner comprises any of boron nitride, boron carbon nitride, borazine, and doped boron nitride.

21. The microelectronic structure of claim 19, wherein the BN liner comprises a thickness between about 5 angstroms and about 800 angstroms.

22. The microelectronic structure of claim 19, further comprising a boron nitride layer below the CNT layer.

23. The microelectronic structure of claim 19, wherein the CNT layer has a thickness between about 10 and about 1000 angstroms.

24. The microelectronic structure of claim 19, wherein the CNT layer comprises one or more of graphene, graphite, amorphous carbon, silicon carbide, and boron carbide.

25. The microelectronic structure of claim 19, further comprising a steering element coupled to the CNT layer.

26. The microelectronic structure of claim 25, wherein the microelectronic structure is a memory device.

27. The microelectronic structure of claim 25, wherein the steering element comprises a diode.

28. The microelectronic structure of claim 27, wherein the diode comprises a semiconductor diode.

29. The microelectronic structure of claim 19, further comprising:
   a bottom electrode disposed below and in contact with the CNT layer; and
   a top electrode disposed above and in contact with the BN liner.

30. The microelectronic structure of claim 29, further comprising:
   a steering element coupled to and in contact with a metal-insulator-metal (MIM) structure,
   wherein the MIM comprises the bottom electrode, the CNT layer, the BN liner, and the top electrode.

* * * * *